United States Patent
Choi et al.

(10) Patent No.: US 9,748,912 B2
(45) Date of Patent: Aug. 29, 2017

(54) METHOD AND APPARATUS FOR DETECTING POWER

(71) Applicants: Jae-Won Choi, Gyeonggi-do (KR); Seong-Sik Myoung, Gyeonggi-do (KR); Jong-Soo Lee, Gyeonggi-do (KR); Dae-Hyun Kwon, Seoul (KR); Bui Quang Diep, Gyeonggi-do (KR); Jae-Hun Lee, Gyeonggi-do (KR); Dong-Jin Oh, Gyeonggi-do (KR)

(72) Inventors: Jae-Won Choi, Gyeonggi-do (KR); Seong-Sik Myoung, Gyeonggi-do (KR); Jong-Soo Lee, Gyeonggi-do (KR); Dae-Hyun Kwon, Seoul (KR); Bui Quang Diep, Gyeonggi-do (KR); Jae-Hun Lee, Gyeonggi-do (KR); Dong-Jin Oh, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 5 days.

(21) Appl. No.: 14/807,356

(22) Filed: Jul. 23, 2015

(65) Prior Publication Data
US 2016/0211880 A1 Jul. 21, 2016

(30) Foreign Application Priority Data
Jan. 16, 2015 (KR) .......................... 10-2015-0007928

(51) Int. Cl.
*H04B 17/00* (2015.01)
*H03G 3/30* (2006.01)
(Continued)

(52) U.S. Cl.
CPC ............. *H03G 3/3042* (2013.01); *H03F 3/19* (2013.01); *H03F 3/245* (2013.01);
(Continued)

(58) Field of Classification Search
CPC .......... H03G 3/3042; H04B 2001/0416; H04B 17/318
(Continued)

(56) References Cited

U.S. PATENT DOCUMENTS

| | | | |
|---|---|---|---|
| 7,010,284 B2 | 3/2006 | Liu et al. | |
| 8,193,858 B2 * | 6/2012 | Camuffo | .............. H03G 3/3047 330/140 |

(Continued)

*Primary Examiner* — David S Huang
(74) *Attorney, Agent, or Firm* — The Farrell Law Firm, P.C.

(57) ABSTRACT

Provided is a Radio Frequency (RF) communication apparatus and a method for detecting power. The RF communication apparatus includes a receiver that receives a segment value indicating one of multiple transmission output power ranges, a power detector that detects a strength of an RF transmission signal in an output power range corresponding to the segment value, and a transmitter that transmits the strength of the detected RF transmission signal. The power detector includes a feedback unit that receives the fed-back RF transmission signal, an RF core unit that generates a Root Mean Square (RMS) of the RF transmission signal, and a converter that converts a current signal corresponding to the RMS of the RF transmission signal into a voltage signal, and converts the converted voltage signal from a differential signal to a single signal.

17 Claims, 20 Drawing Sheets

(51) Int. Cl.
*H03F 3/19* (2006.01)
*H03F 3/24* (2006.01)
*H03F 3/45* (2006.01)

(52) U.S. Cl.
CPC ..... *H03F 3/45179* (2013.01); *H03F 3/45475* (2013.01); *H03F 2200/451* (2013.01); *H03F 2200/465* (2013.01); *H03F 2203/45394* (2013.01); *H03F 2203/45522* (2013.01); *H03F 2203/45526* (2013.01)

(58) Field of Classification Search
USPC .................................... 375/222, 296, 297
See application file for complete search history.

(56) References Cited

U.S. PATENT DOCUMENTS

| | | |
|---|---|---|
| 2002/0132652 A1 | 9/2002 | Steel et al. |
| 2004/0174214 A1 | 9/2004 | Liu et al. |
| 2004/0209584 A1* | 10/2004 | Bargroff .................. H03D 7/00 455/180.1 |
| 2006/0066403 A1 | 3/2006 | Grillo et al. |
| 2007/0259628 A1 | 11/2007 | Carmel et al. |
| 2008/0024191 A1 | 1/2008 | Zou |
| 2008/0136491 A1 | 6/2008 | Zou |
| 2008/0309321 A1 | 12/2008 | Ahn et al. |
| 2011/0121896 A1 | 5/2011 | Eken et al. |
| 2014/0084987 A1 | 3/2014 | Beale et al. |
| 2014/0091814 A1 | 4/2014 | Boucey et al. |
| 2014/0118050 A1 | 5/2014 | Prakash et al. |

\* cited by examiner

US 9,748,912 B2

METHOD AND APPARATUS FOR DETECTING POWER

PRIORITY

This application claims the priority under 35 U.S.C. §119(a) to Korean Application Serial No. 10-2015-0007928, which was filed in the Korean Intellectual Property Office on Jan. 16, 2015, the entire content of which is incorporated herein by reference.

BACKGROUND

1. Field of the Disclosure

The present disclosure relates generally to a wireless communication system and, more particularly, to a method and an apparatus for detecting transmission power in a wireless communication system.

2. Description of the Related Art

A power detector detects output power of a Radio Frequency (RF) transceiver in a wireless communication system.

The power detector may include multiple gain amplifiers and multiple current conversion circuits, with an input voltage of the power detector amplified by the multiple gain amplifiers, and the amplified input voltage converted into a current by each of the multiple current conversion circuits. The sum of the currents, which are output from the multiple current conversion circuits, appears at an output terminal of the power detector, with an output voltage of the power detector obtained across an output resistor ($R_{out}$).

When each of the multiple gain amplifiers operates in a saturation state, the output voltage of the power detector may linearly increase. The output voltage of the power detector has a transfer function, having an ideal linear response and a predetermined slope in response to input power, in a desired input power range. The power detector may need a wide dynamic range, wider than or equal to 40 dB, in order to detect an entire transmission output power range.

As described above, power detectors determine an output voltage by combining currents from each of multiple current conversion circuits. However, all of the multiple gain amplifiers and all of the multiple current conversion circuits must simultaneously operate, resulting in significant power consumption.

Also, power detectors often have difficulty outputting a pure linear response since the gain amplifiers and the current conversion circuits are not ideal elements. The non-linear characteristics of these non-ideal elements cause a curved output of the power detectors. Further, input power has a variable peak component which affects a dynamic range of a gain amplifier, causing an error at an input power transition point.

Therefore, additional calibration is needed to maintain linearity of the output voltage of power detectors.

SUMMARY

Accordingly, the present disclosure has been made to address problems and disadvantages described above and provides at least the advantages described below, with embodiments of the present disclosure providing an apparatus and a method for detecting power having a wide dynamic range and linearity.

An aspect of the present disclosure provides an apparatus and a method which, when an input power range is divided into multiple segments, controls states of a gain amplifier and a Root Mean Square (RMS) circuit of a power detector in response to the value of each segment.

Another aspect of the present disclosure provides an apparatus and a method for reducing the number of gain amplifiers and current conversion circuits of a power detector, to reduce power consumption.

Still another aspect of the present disclosure provides an apparatus and a method that provides accurate output voltage information by detecting an output voltage in a linear region of an output voltage curve of a power detector corresponding to the value of each segment.

Yet another aspect of the present disclosure provides an apparatus and a method that adjust a gain of transmission output power through detected power.

In accordance with an aspect of the present disclosure, a Radio Frequency (RF) communication apparatus is provided. The RF communication apparatus includes a first reception unit that receives a segment value indicating one of multiple transmission output power ranges; a power detector that detects a strength of an RF transmission signal in an output power range corresponding to the segment value; and a first transmission unit that transmits the strength of the detected RF transmission signal, wherein the power detector includes: a feedback unit that receives the fed-back RF transmission signal; an RF core unit that generates a Root Mean Square (RMS) of the RF transmission signal; and a converter that converts a current signal corresponding to the RMS of the RF transmission signal into a voltage signal, and converts the converted voltage signal from a differential signal to a single signal.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
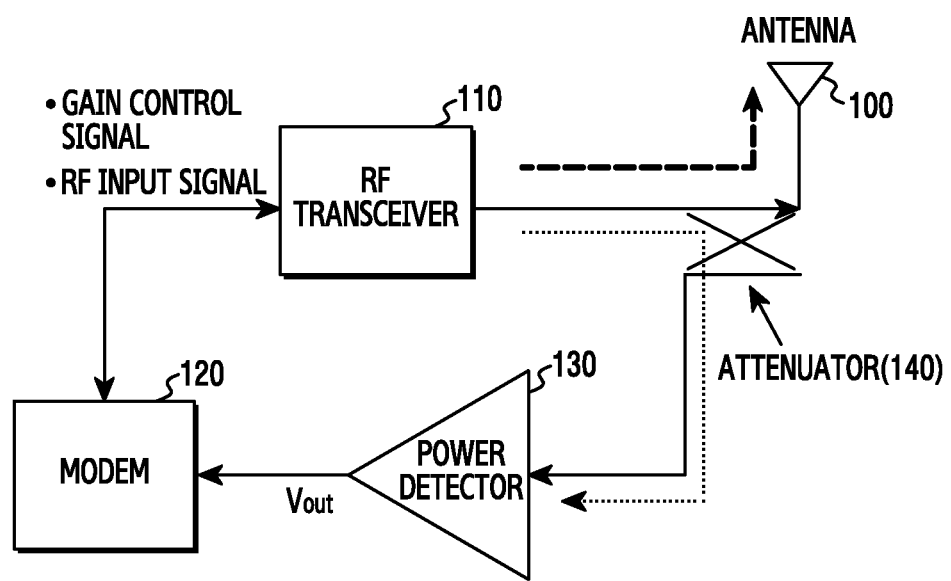
FIG. 1 is a block diagram illustrating a communication apparatus according to an embodiment of the present disclosure.

Hereinafter, embodiments of the present disclosure will be described in detail with reference to the accompanying drawings. Further, in the following description of the present disclosure, a detailed description of known functions and configurations incorporated herein will be omitted when it may make the subject matter of the present disclosure unclear. Meanwhile, terms are defined in consideration of the functions of the present disclosure, with the meaning of the terms recognized to change according to a user, intention of an operator, or convention. Accordingly, the terms should be defined based on the contents over the entire specification.

Hereinafter, a description will be made of a communication apparatus and a method for detecting power according to embodiments of the present disclosure.

In accordance with an aspect of the present disclosure, a Radio Frequency (RF) communication apparatus is provided. The RF communication apparatus includes a transmitter configured to transmit an RF transmission signal, a receiver configured to receive a segment value indicating one of multiple transmission output power ranges, an attenuator configured to receive feed back of the transmitted RF transmission signal, and a power detector configured to detect a strength of the RF transmission signal in an output power range corresponding to the segment value.

In accordance with an aspect of the present disclosure, a modem is provided that includes a controller configured to receive information on a target transmission output power provided from a base station and to control determination of a segment value indicating one of multiple transmission output power ranges according to the target transmission output power, a gain table storage unit configured to provide the segment value to an RF communication apparatus, and a correction unit configured to receive a strength of a detected RF transmission signal from the RF communication apparatus in response to the determined segment value.

In accordance with a further aspect of the present disclosure, a method of operating an RF communication apparatus is provided that includes receiving a segment value indicating one of multiple transmission output power ranges, detecting a strength of an RF transmission signal in an output power range corresponding to the segment value by generating a Root Mean Square (RMS) of the RF transmission signal, and transmitting the detected strength of the RF transmission signal.

In accordance with another aspect of the present disclosure, an RF integrated circuit is provided that includes an RF transceiver configured to transmit and receive an RF transmission signal, an attenuator configured to receive feed back of the transmitted RF transmission signal, and a power detector configured to detect a strength of the RF transmission signal in an output power range corresponding to the segment value.

In accordance with another aspect of the present disclosure, an integrated circuit is provided that includes a Radio Frequency (RF) transceiver configured to transmit and receive an RF signal, an attenuator configured to receive feed back of a transmitted RF signal and a power detector configured to detect a strength of the transmitted RF signal in an output power range corresponding to a segment value in one of multiple transmission output power ranges.

The power detector comprises an RF core unit configured to generate a Root Mean Square (RMS) of the RF signal and a converter configured to convert the RMS of the transmitted RF signal into an RMS voltage signal.

The RF core unit comprises at least two gain amplifiers configured to amplify a gain of the RF signal, at least two RMS circuits configured to receive the RF signal, and generate a difference between a first current and a second current, wherein the difference between the first current and the second current is a square of the RF signal and multiple switch segments configured to activate or deactivate at least one gain amplifier of the at least two gain amplifiers and at least one RMS circuit of the at least two RMS circuits according to the segment value.

At least two RMS circuits are connected to output terminals of the at least two gain amplifiers, respectively.

Each of the RMS circuits outputs a square value of the RF signal in an output power range corresponding to the segment value.

The multiple transmission output power ranges are distinguished from each other by one of activation and deactivation of one or more of the at least one gain amplifier and the at least one RMS circuit.

In accordance with another aspect of the present disclosure, a mobile terminal is provided that includes a transmitter configured to transmit an RF signal, an attenuator configured to feed back a strength of the RF signal, a power detector configured to detect the strength of RF signal based on a segment value indicating one of multiple transmission output power ranges, a correction unit configured to correct output of the power detector based on an average output value of the strength of the RF signal and at least two RMS circuits configured to generate a Root Mean Square (RMS) of the RF signal, each RMS of the at least two RMS circuits is converted into an RMS voltage signal, and an absolute value of a difference between each RMS is output to the correction unit to update a transmission gain control.

FIG. 1 is a block diagram illustrating a communication apparatus according to an embodiment of the present disclosure.

Referring to FIG. 1, the communication apparatus includes an RF transceiver 110, a modem 120, a power detector 130, and an attenuator 140. Although not illustrated, the communication apparatus may further include a power amplifier, which amplifiers an RF transmission signal, between the RF transceiver 110 and an antenna 100. According to various embodiments of the present disclosure, the communication apparatus may further include a Power Amplifier Module (PAM), which includes multiple power amplifiers, between the RF transceiver 110 and the antenna according to various embodiments of the present disclosure.

The modem 120 modulates a baseband signal according to a communication scheme and outputs the modulated baseband signal to the RF transceiver 110, or receives a baseband signal from the RF transceiver 110 and may demodulate the received baseband signal according to the communication scheme.

Also, in various embodiments of the present disclosure, the modem 120 provides the RF transceiver 110 with a signal, which controls a gain of a transmission output signal based on a power control procedure, and a segment value indicating one of multiple transmission output power ranges. For example, the modem 120 may determine or update a target transmission output power according to a Transmitter Power Command (TPC) received from a base station, and may control a gain of a transmission signal in response to the determined target transmission output power.

The modem 120 receives information, e.g., an average value of transmission output signals, based on the strength of a transmission output signal from the power detector 130, and determines a gain of the transmission output signal on the basis of the information on the strength of the transmission output signal. For example, when power of a transmission output signal detected by the power detector 130 is smaller than the target transmission output power, the modem 120 may increase the gain. In contrast, when the power of the transmission output signal detected by the power detector 130 is larger than or equal to that of the target transmission output signal, the modem 120 may reduce the gain.

The RF transceiver 110 converts a baseband signal, which is output from the modem 120, into an RF signal and outputs the RF signal to the antenna 100. The RF transceiver 110 converts an RF signal, which is received via the antenna 100, into a baseband signal and outputs the baseband signal to the modem 120.

The attenuator 140 attenuates an RF transmission output signal, to be transmitted via the antenna 100, and may provide the attenuated RF transmission output signal to the power detector 130. The power detector 130 receives an RF transmission output signal fed back from the attenuator 140, detects power or the strength of the RF transmission output signal, and provides a result of the detection to the modem 120. Desirably, an output of the power detector 130 is a voltage output. The power detector 130 will be described in detail below with reference to FIG. 3.

The power detector 130 detects a consistent voltage with respect to an identical input power. Also, a dynamic range for detecting an output voltage allows the detection of accurate output power in a required input range. For example, if the required input range is −10~0 dBm, the power detector 130 detects the output voltage of the communication apparatus in −10~0 dBm of the dynamic range (−36~0 dBm), if the required input range is −18~−10 dBm, the power detector 130 detects the output voltage of the communication apparatus in −18~−10 dBm of the dynamic range (−36~0 dBm), if the required input range is −26~−18 dBm, the power detector 130 detects the output voltage of the communication apparatus in −26~−18 dBm of the dynamic range (−36~0 dBm), and if the required input range is −36~−26 dBm, the power detector 130 detects the output voltage of the communication apparatus in −36~−26 dBm of the dynamic range (−36~0 dBm).

In the communication apparatus of FIG. 1, the attenuator 140, the RF transceiver 110, and the power detector 130 are illustrated as being implemented by separated elements. However, the attenuator 140, the RF transceiver 110, and the power detector 130 may be implemented by one chip, e.g., a Radio Frequency Integrated Circuit (RFIC).

Figure 2:
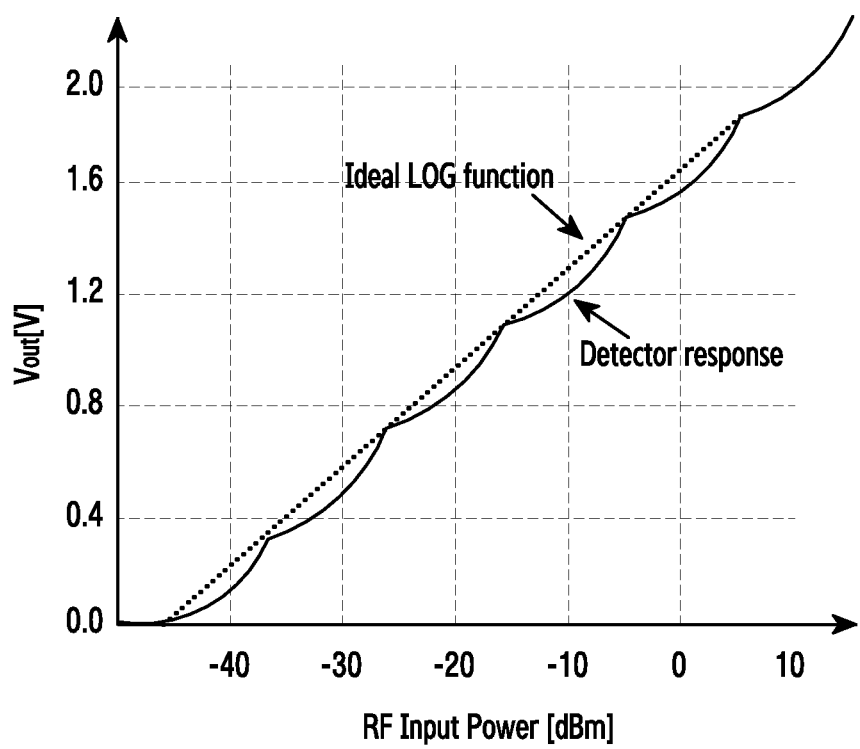
FIG. 2 is a graph illustrating a slope of an output voltage according to RF input power in a power detector according to an embodiment of the present disclosure.

FIG. 2 is a graph illustrating a slope of an output voltage according to RF input power in a power detector according to an embodiment of the present disclosure.

Referring to FIG. 2, an output voltage linearly detected is compared to an ideal case.

As shown in FIG. 2, the output voltage appears as a curve in each range of RF input power, due to a nonlinear characteristic of each element, e.g., each gain amplifier or current conversion circuit, of the power detector 130.

Accordingly to embodiments of the present disclosure, the power detector 130 provides a wide dynamic range and linearity by dividing an RF input power range into multiple segments, and activating or deactivating respective gain amplifiers and RMS circuits of the in response to the value of the transmission output signals of each segment.

Figure 3:
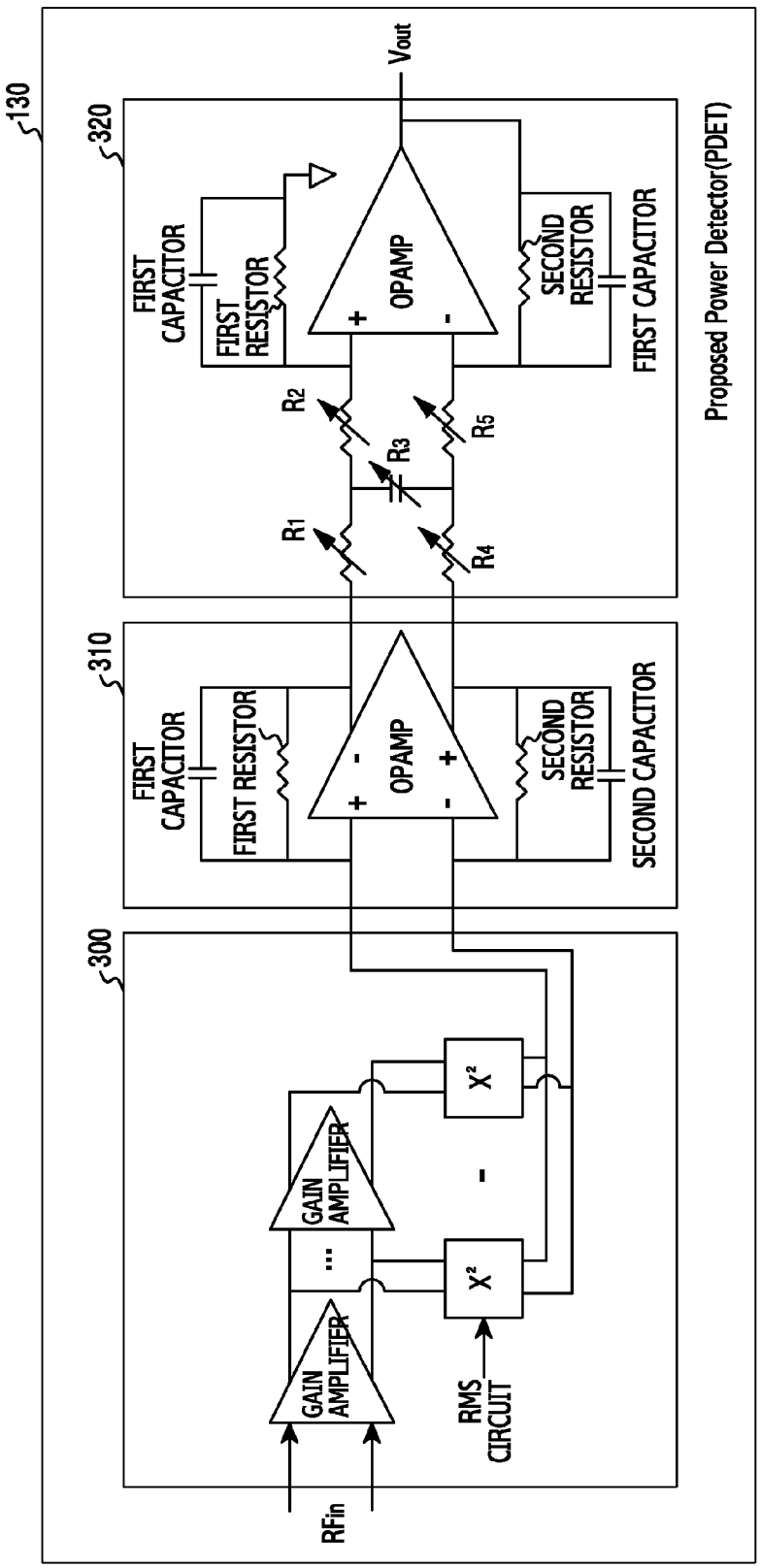
FIG. 3 is a block diagram illustrating a configuration of a power detector according to an embodiment of the present disclosure.

FIG. 3 is a block diagram illustrating a configuration of a power detector according to an embodiment of the present disclosure.

Referring to FIG. 3, the power detector 130 includes an RF core unit 300, a first converter 310, and a second converter 320.

The RF core unit 300 generates an RMS of an RF transmission signal and outputs, to the first converter 310, a current signal corresponding to the generated RMS. As shown in FIG. 3, the RF core unit 300 may include multiple gain amplifiers that amplify a gain of the RF transmission signal, with multiple RMS circuits connected to output terminals of the respective gain amplifiers to generate an RMS of the amplified RF transmission signals.

The number of the gain amplifiers and the RMS circuits included in the RF core unit 300 is determined according to a range of RF output power. For example, the number of the gain amplifiers and the RMS circuits will increase as the range of RF output power becomes wider, and the number of the gain amplifiers and the RMS circuits will decrease as the range of RF output power becomes narrower.

Figure 7:
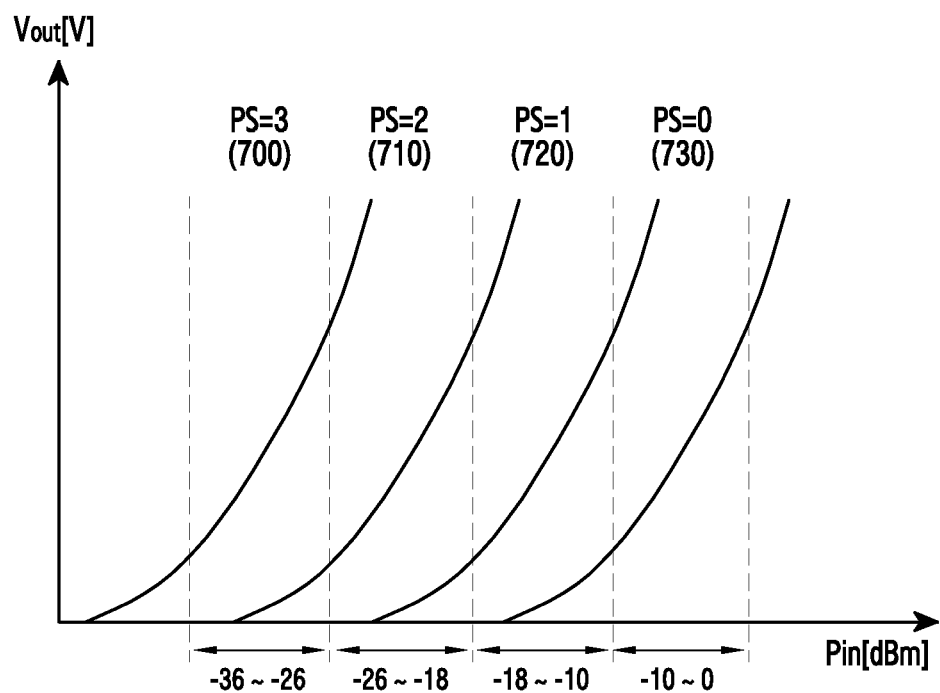
FIG. 7 is a graph illustrating a slope of an output voltage according to RF input power in a power detector according to an embodiment of the present disclosure.

Meanwhile, in various embodiments of the present disclosure, an entire range of the detected transmission output power may be divided into multiple segments. For example, as illustrated in FIG. 7, −10~0 dBm is mapped to segment zero (PS=0) 730, −18~−10 dBm is mapped to segment one (PS=1) 720, −26~−18 dBm is mapped to segment two (PS=2) 710, and −36~−26 dBm is mapped to segment three (PS=3) 700.

The entire range of the detected transmission output power is divided into multiple transmission output power ranges. The multiple transmission output power ranges are obtained by activating or deactivating the multiple gain amplifiers and the multiple RMS circuits connected to the output terminals of the respective gain amplifiers within the RF core unit 300. For example, FIGS. 5A to 5D and FIGS. 6A to 6D illustrate four gain amplifiers and four RMS circuits being turned on or off according to four segments. FIGS. 5A-5D and 6A-6D are described in detail below.

The first converter 310 converts the current signal, which is a differential signal corresponding to the RMS of the RF transmission signal into a voltage signal. Differential signal can be current signal or voltage signal. It depends on circuit blocks in/out. That is, input signal of the second converter 320 (or output signal of the first converter 310) is a differential signal and output signal of the second converter 320 is a single signal. The first converter 310 includes an operational amplifier (opamp), a first resistor, a first capacitor, a second resistor, and a second capacitor. The first resistor and the first capacitor may be connected to a first input terminal and a first output terminal of the opamp, and the second resistor and the second capacitor may be connected to a second input terminal and a second output terminal of the opamp.

The second converter 320 converts the converted voltage signal from the differential signal to a single signal.

As shown in FIG. 3, the second converter 320 may include multiple variable resistors, an opamp, a first resistor, a first capacitor, a second resistor, and a second capacitor. The first resistor and the first capacitor may be connected to a first input terminal and a ground connection of the opamp, and the second resistor and the second capacitor may be connected to a second input terminal and an output terminal of the opamp.

Figure 4:
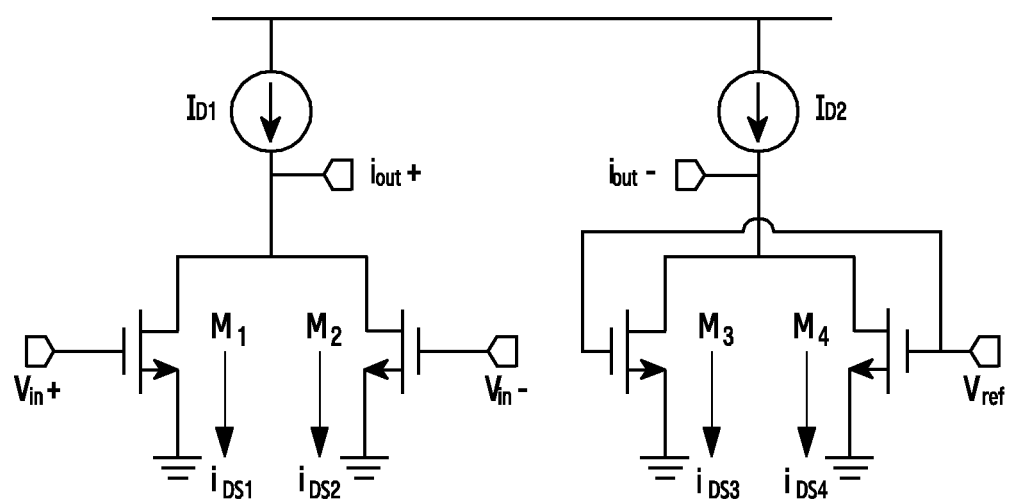
FIG. 4 illustrates an RMS circuit of a power detector according to an embodiment of the present disclosure.

FIG. 4 illustrates an RMS circuit of a power detector according to an embodiment of the present disclosure.

Referring to FIG. 4, the RMS circuit may include two differential amplifiers.

The first differential amplifier includes transistors $M_1$ and $M_2$ that receive input signals $v_{in}+$ and $v_{in}-$. An RF transmission signal passes through the multiple gain amplifiers and generates an output current $i_{out}+$. Transistors $M_3$ and $M_4$ of the second differential amplifier receive a reference voltage $v_{ref}$ as an input signal and generate an output current $i_{out}-$. Here, the second differential amplifier generates a DC offset value in order to cause a Direct Current (DC) reference point to be equal to zero. Drain currents, which flow through the transistors $M_1$, $M_2$, $M_3$ and $M_4$ are represented by $i_{DS1}$, $i_{DS2}$, $i_{DS3}$ and $i_{DS4}$, respectively.

Here, a difference, i.e., $i_{out}+-i_{out}-$, between the output currents of the differential amplifiers may be obtained from Equation (1):

$$i_{out^+} - i_{out^-} = \frac{1}{2} K v_{RF}^2 \qquad (1)$$

In Equation (1), $v_{ref}$ represents the strength of an RF transmission signal, and K represents a parameter value.

The RMS circuit preferably outputs a root mean square voltage

FIGS. 5A to 5D illustrate operation states of a power detector to output segment values corresponding to respective output ranges.

Figure 5A:
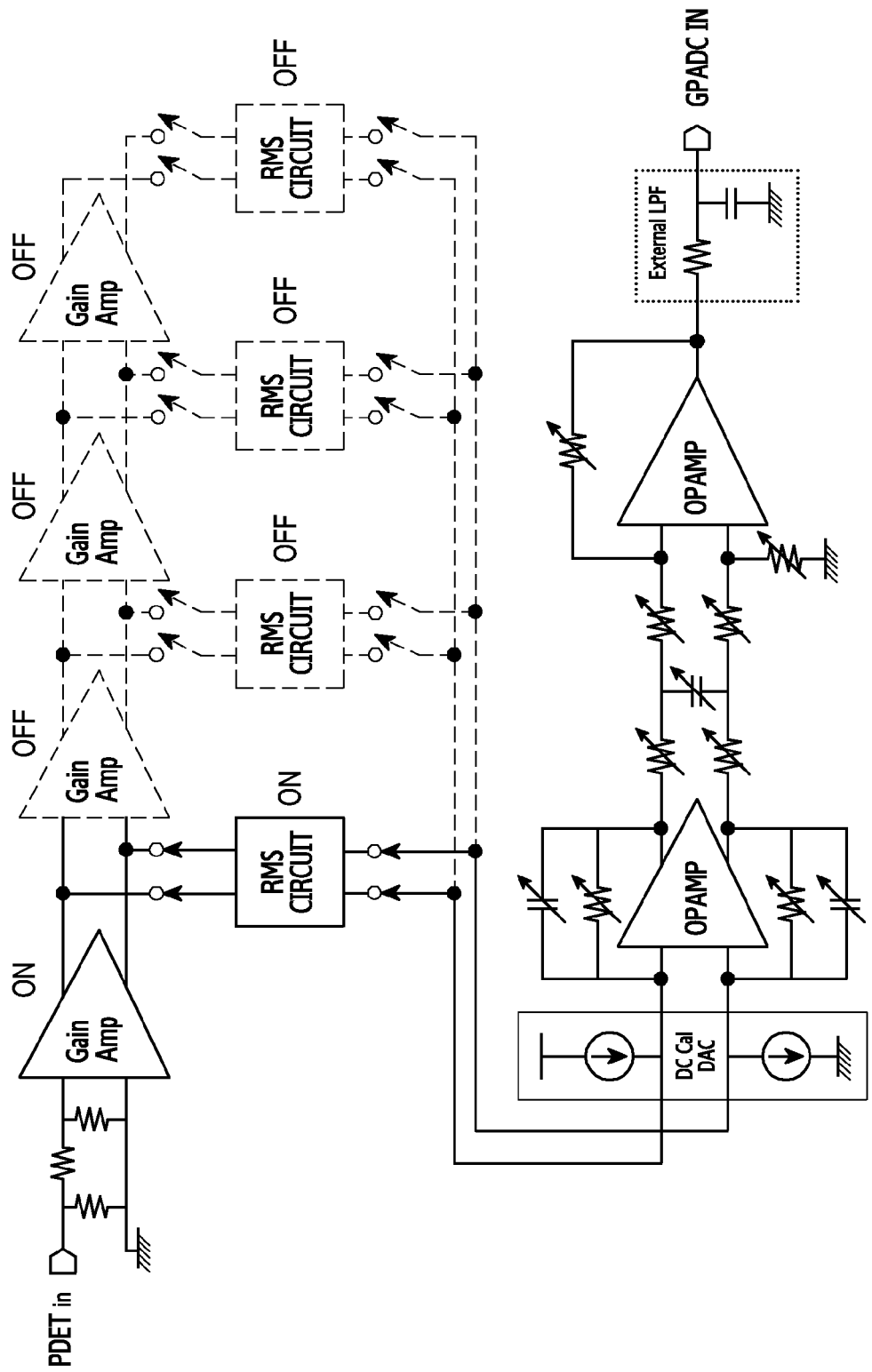
FIGS. 5A to 5D illustrate operation states of a power detector according to output segment values corresponding to respective output ranges.

FIG. 5A illustrates on/off states of four gain amplifiers and four RMS circuits when a segment value is equal to PS=0, namely, when an output voltage is measured in the output power range of 10~0 dBm (See FIG. 7, item 730). As shown in FIG. 5A, when the segment value is equal to zero, only the first gain amplifier and the first RMS circuit turn on, and the remaining second to fourth gain amplifiers and the remaining second to fourth RMS circuits turn off.

Figure 5B:
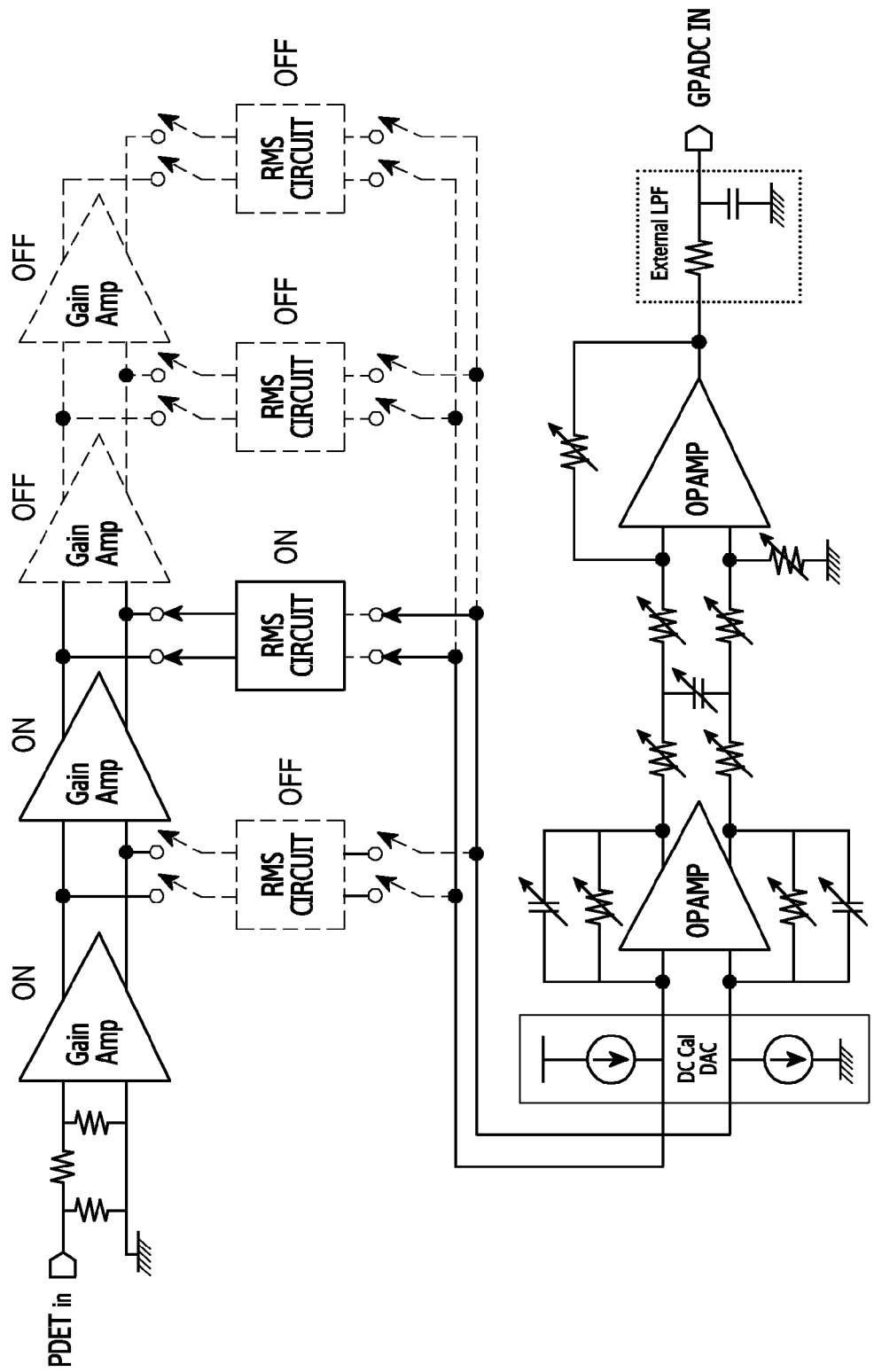

Referring to FIG. 5B, when the segment value is equal to PS=1, namely, when an output voltage is measured in the output power range of 18~10 dBm (See FIG. 7, item 720), only the first and second gain amplifiers and the second RMS circuit turn on, and the remaining third and fourth gain amplifiers and the remaining first, third and fourth RMS circuits turn off.

Figure 5C:
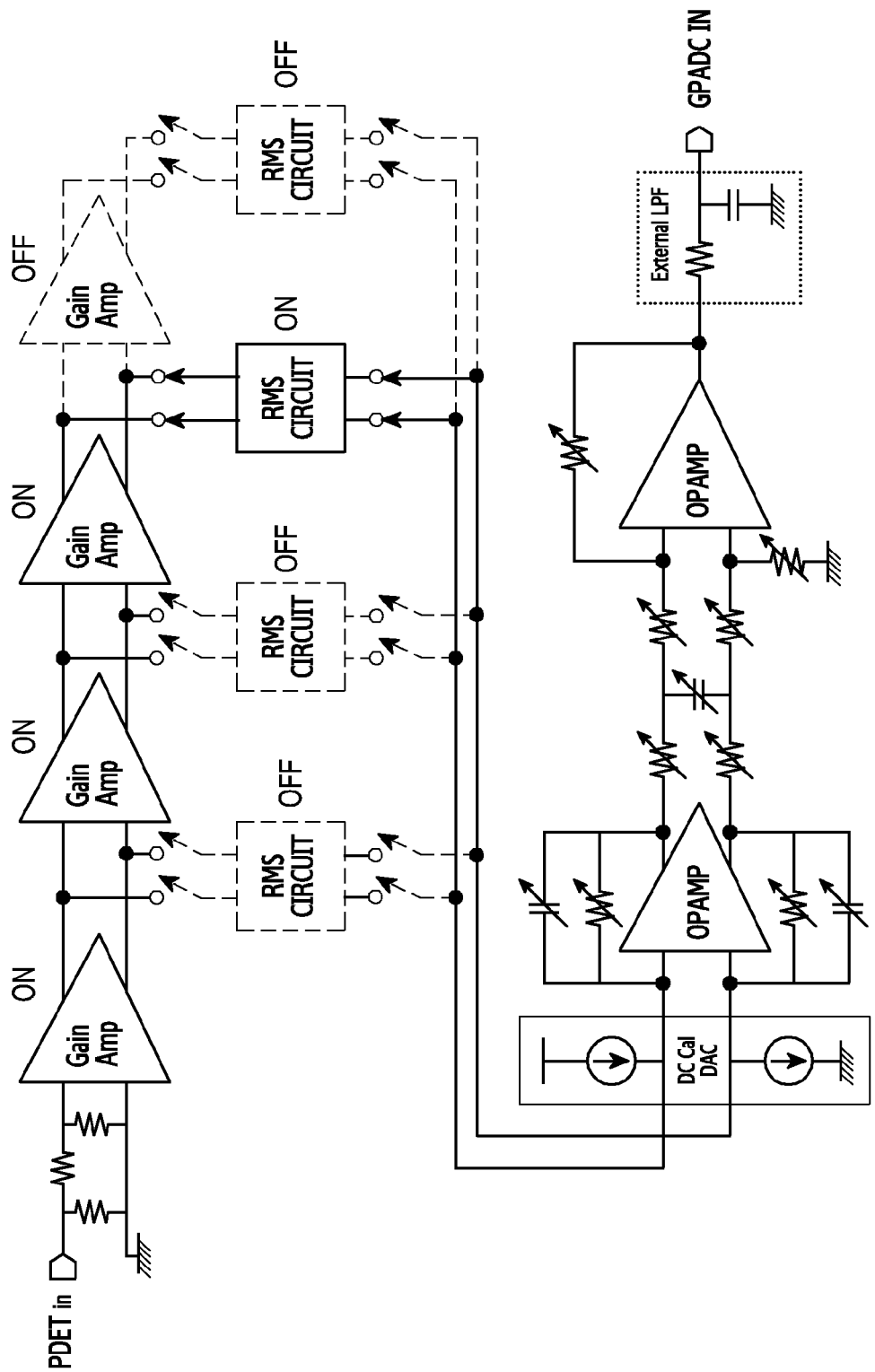

Referring to FIG. 5C, when the segment value is equal to PS=2, namely, when an output voltage is measured in the output power range of 26~18 dBm (See FIG. 7, item 710), only the first to third gain amplifiers and the third RMS circuit turn on, and the remaining fourth gain amplifier and the remaining first, second and fourth RMS circuits turn off.

Figure 5D:
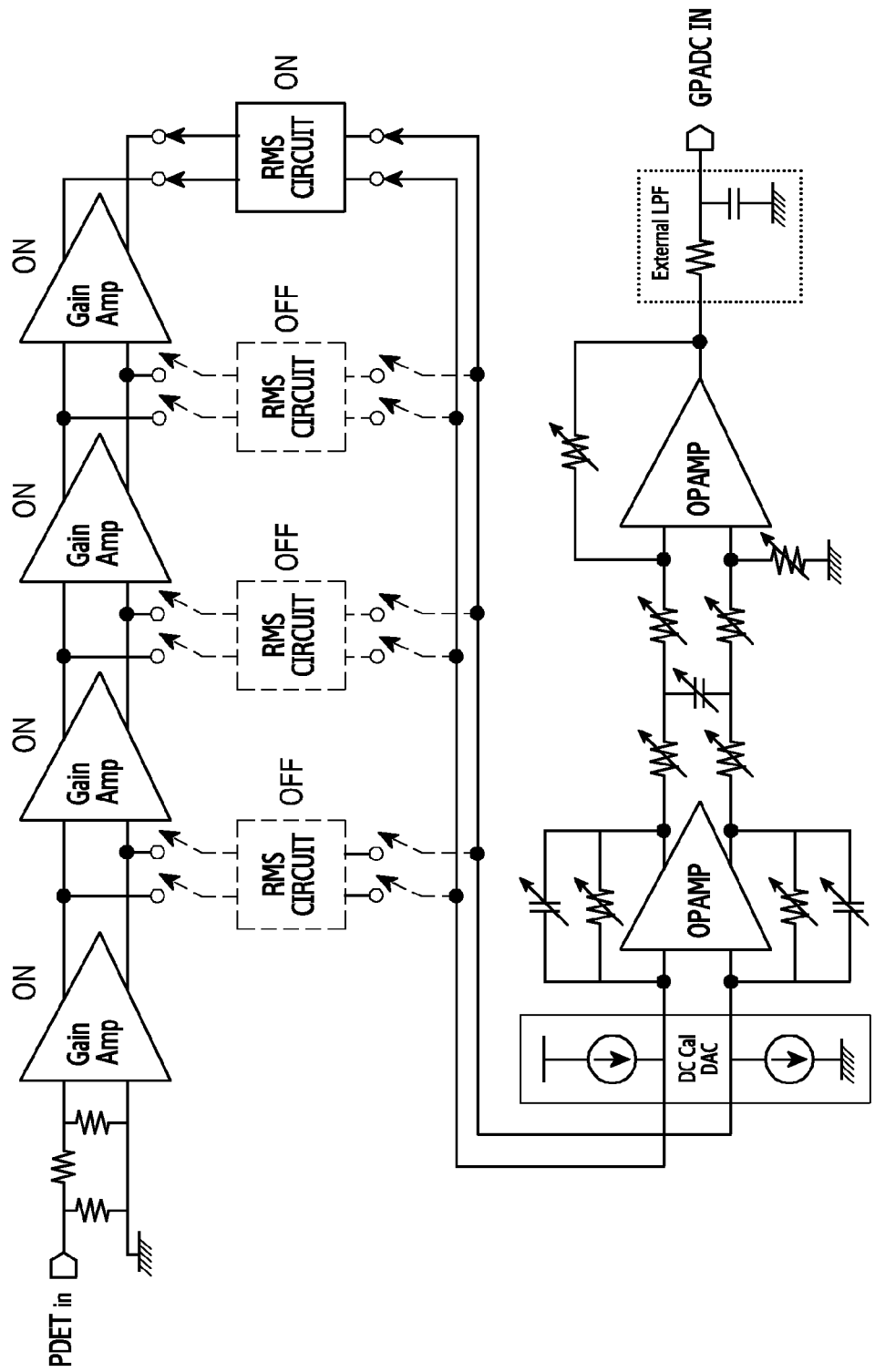
Figure 6A:
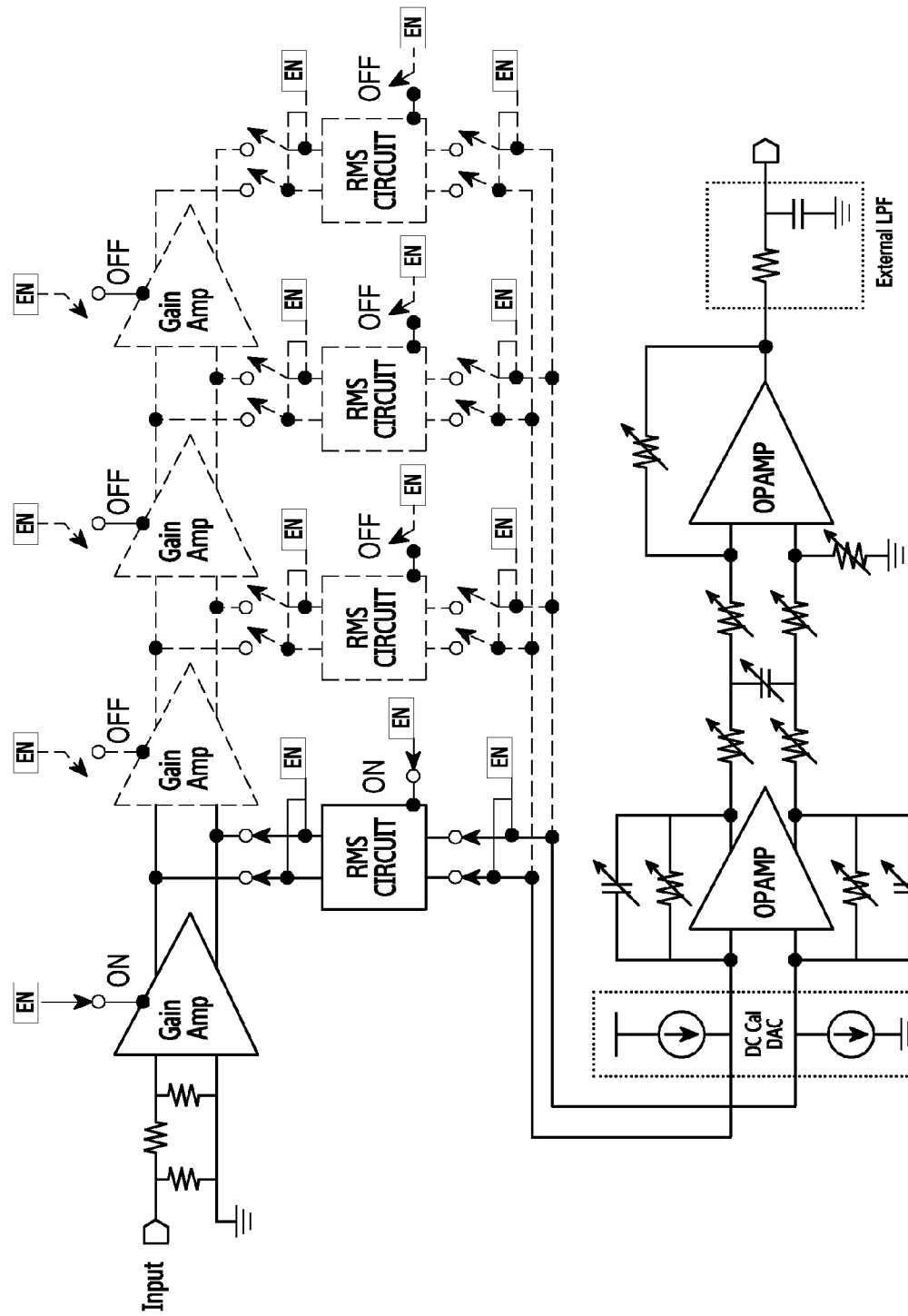
FIGS. 6A to 6D illustrate operation states of another power detector according to output segment values corresponding to respective output ranges.
Figure 6B:
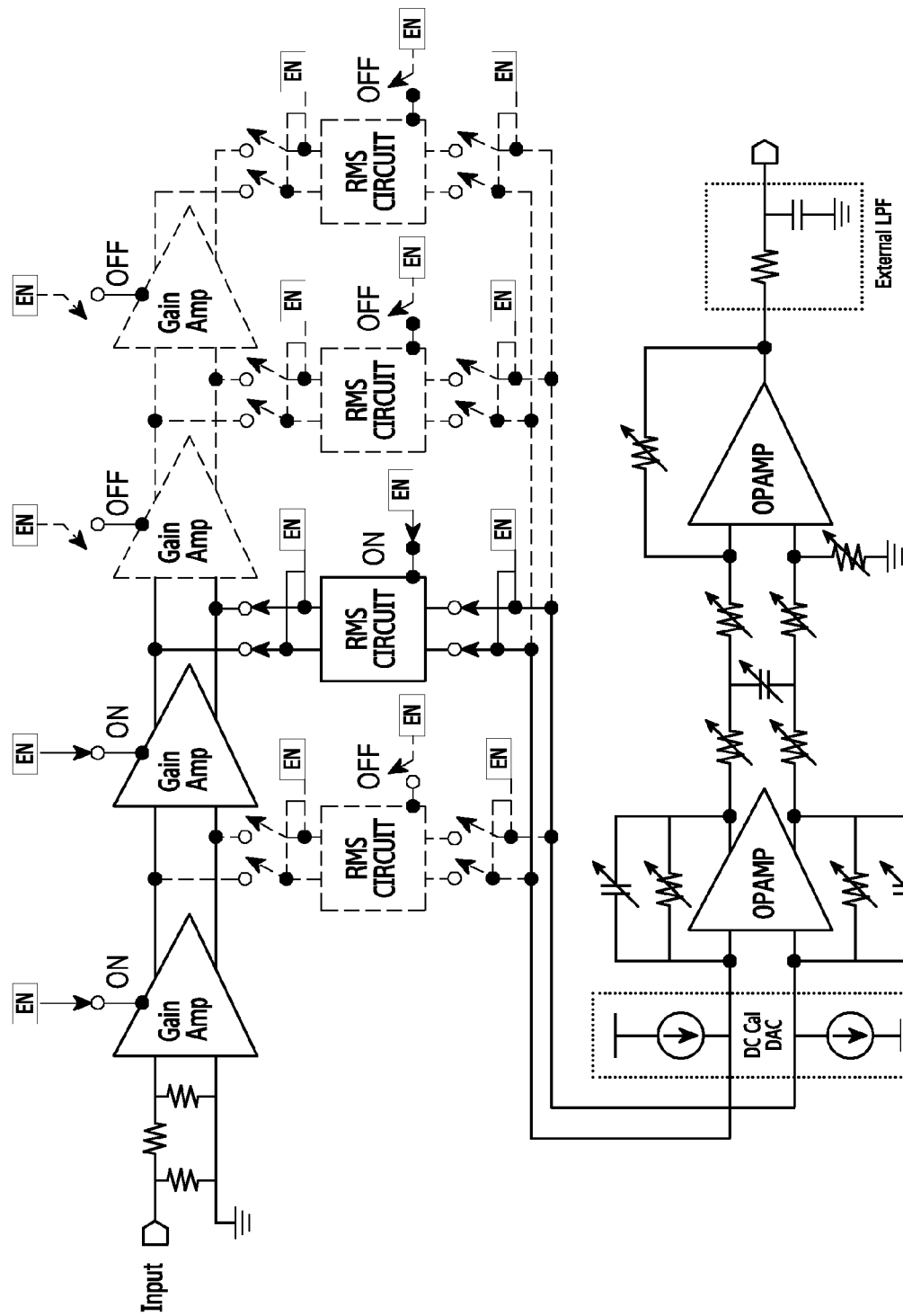
Figure 6C:
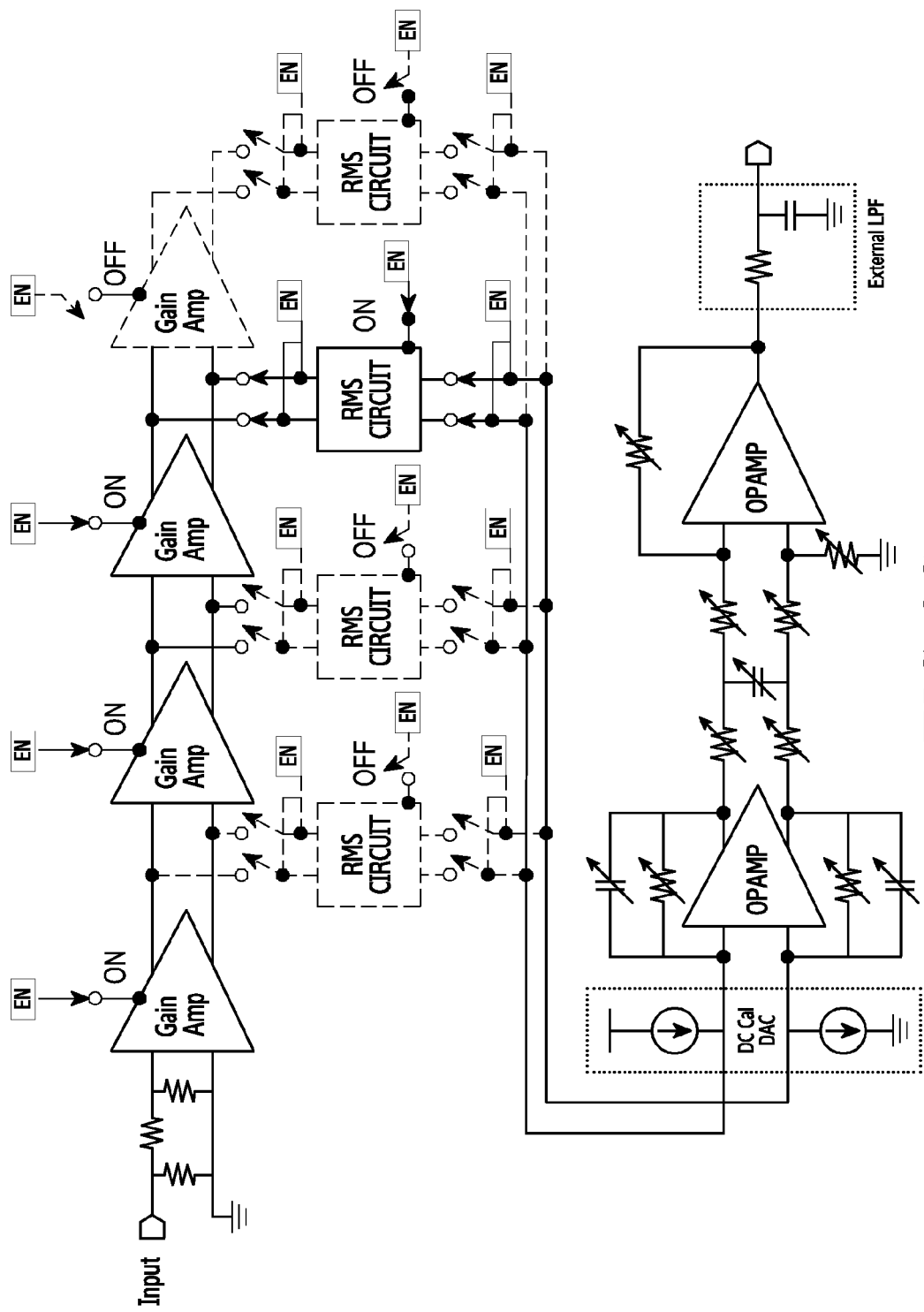
Figure 6D:
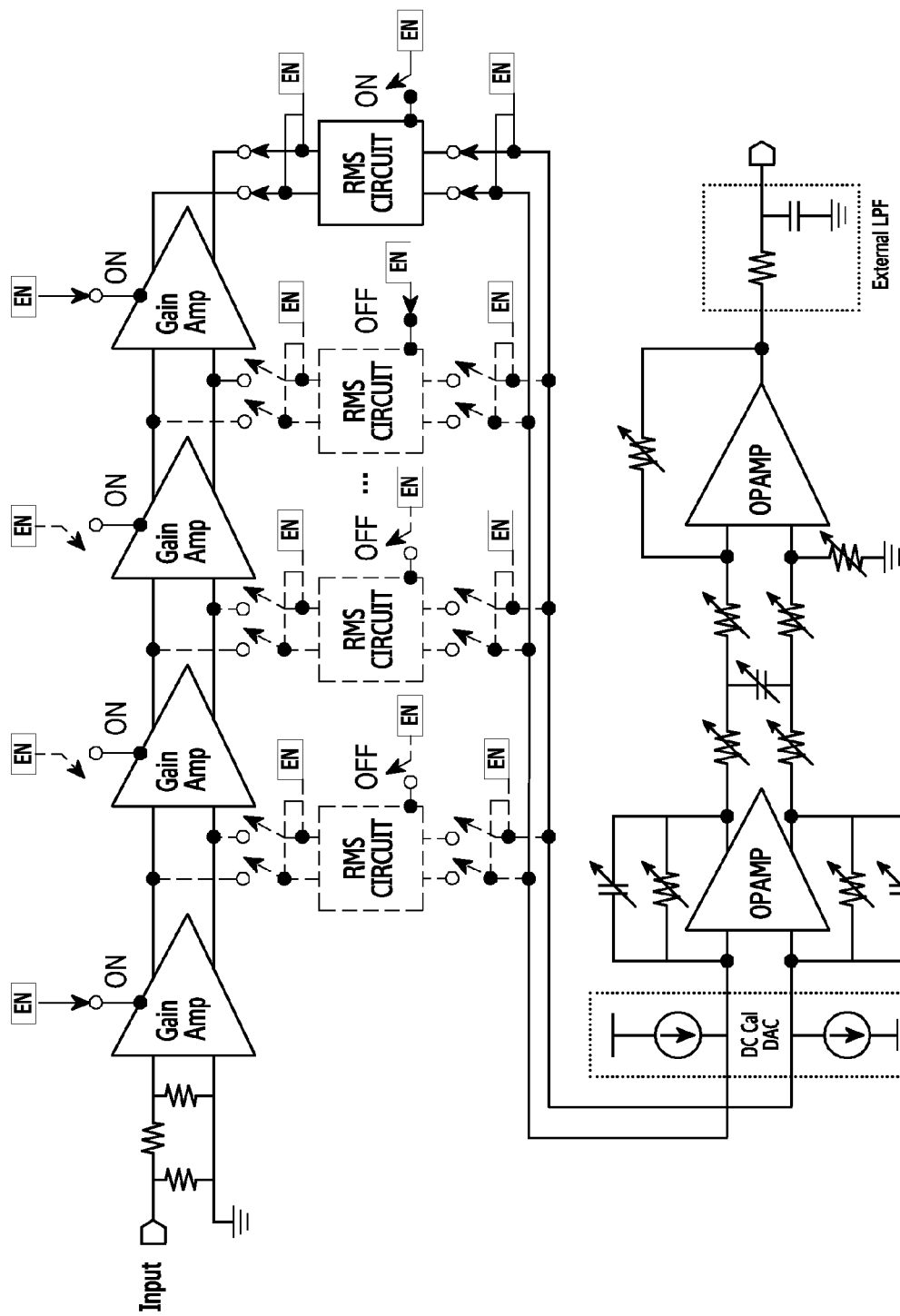

Referring to FIG. 5D, when the segment value is equal to PS=3, namely, when an output voltage is measured in the output power range of 36~26 dBm (See FIG. 7, item 700), the first to fourth gain amplifiers and only the fourth RMS circuit turn on, and the remaining first, second and third RMS circuits turn off.

FIGS. 5A to 5D illustrate that, in order to activate or deactivate a gain amplifier or an RMS circuit, a switch is connected to an output terminal or an input terminal of the gain amplifier or the RMS circuit and turns on or off a signal which is input or output.

FIGS. 6A to 6D illustrate operation states of another power detector according to output segment values corresponding to respective output ranges.

FIGS. 6A to 6D illustrate operation of gain amplifiers and RMS circuits similar to the operation described above for FIGS. 5A to 5D, additionally including enable (EN) circuits for direct operation of respective gain amplifiers and RMS circuits.

FIG. 7 is a graph illustrating a slope of an output voltage according to RF input power in a power detector according to an embodiment of the present disclosure. As described above, FIG. 7 shows that an entire transmission output power range may be divided into segments of −10~0 dBm, −18~−10 dBm, −26~−18 dBm, and −36~−26 dBm. As described above, the transmission output power ranges are distinguished from each other according to an activated state or a deactivated state of a respective gain amplifiers or RMS circuits.

Figure 8:
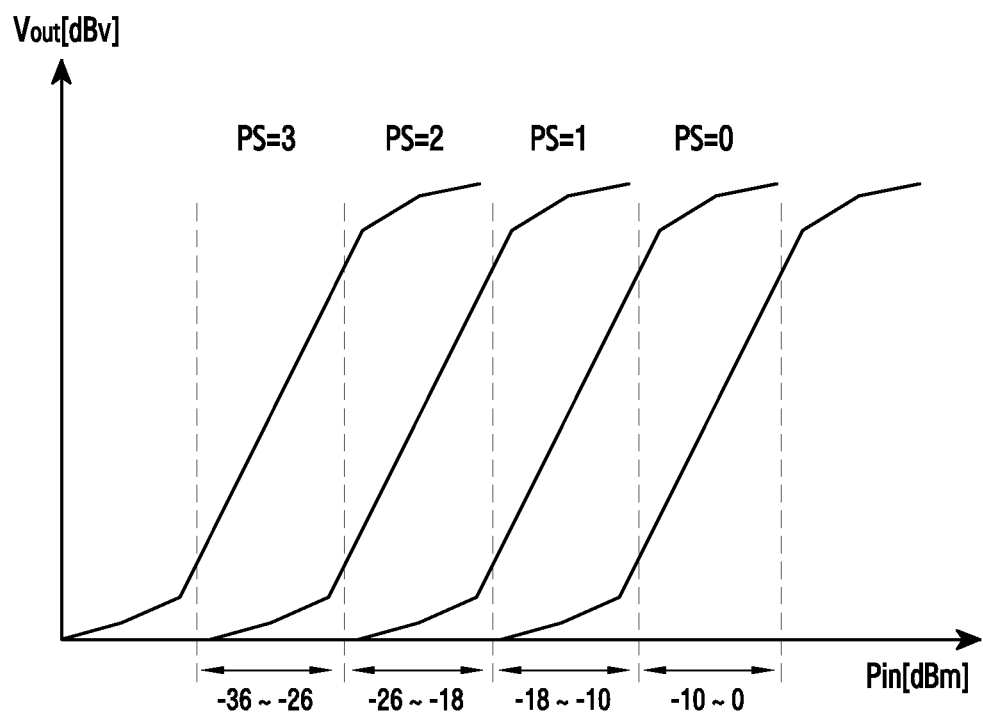
FIG. 8 is a graph illustrating a slope of an output voltage according to RF input power in a power detector according to an embodiment of the present disclosure.

FIG. 8 is a graph illustrating a slope of an output voltage according to RF input power in a power detector according to an embodiment of the present disclosure.

In FIG. 8 shows the output voltage of FIG. 7 in dB units.

Figure 9:
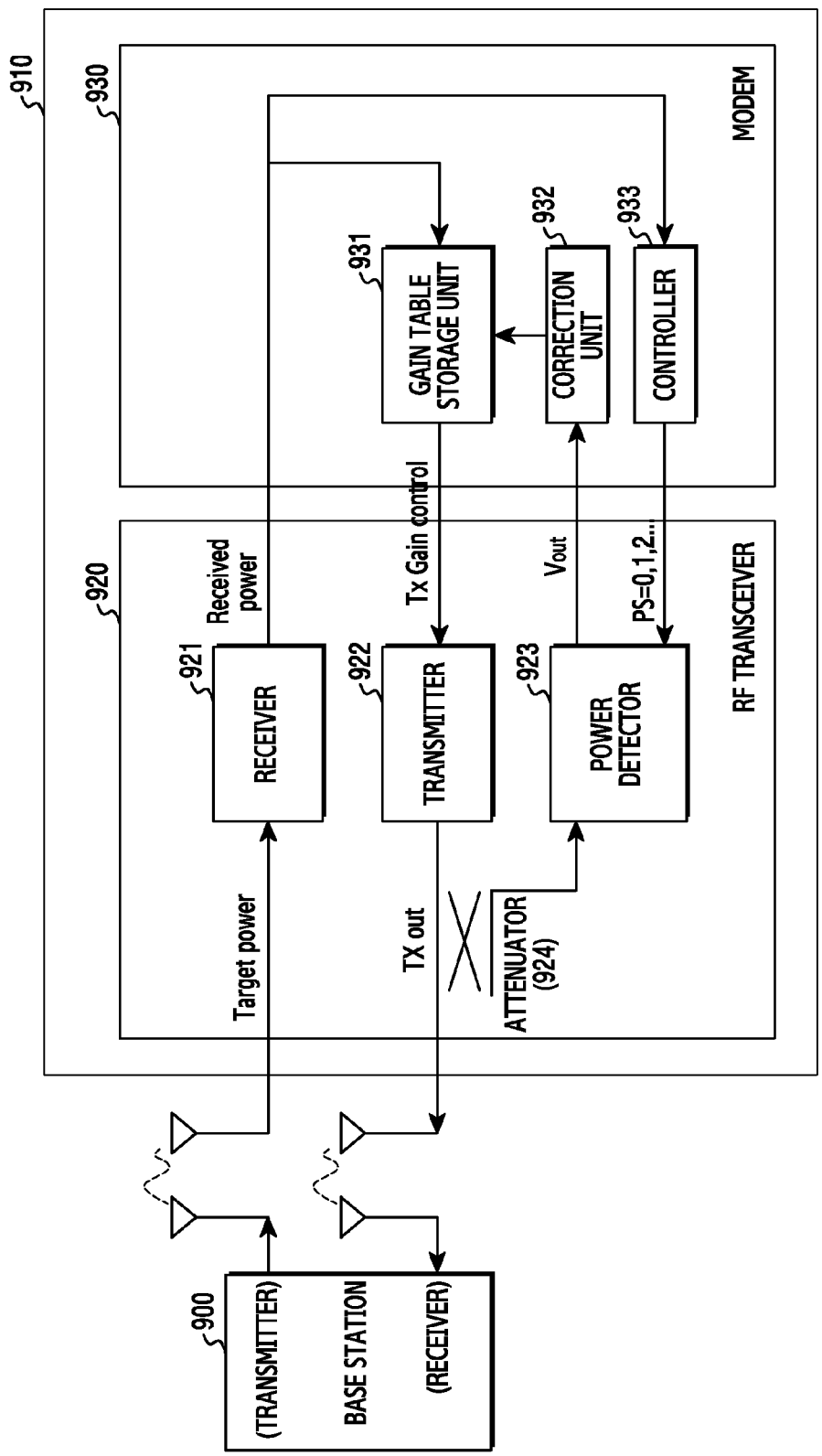
FIG. 9 is a block diagram illustrating a configuration of a wireless communication system according to an embodiment of the present disclosure.

FIG. 9 is a block diagram illustrating a configuration of a wireless communication system according to an embodiment of the present disclosure.

Referring to FIG. 9, the wireless communication system may include a base station 900 and a terminal 910. The terminal 910 includes an RF transceiver 920, which includes a receiver 921, a transmitter 922, a power detector 923, and an attenuator 924. The terminal 910 also includes a modem 930 which includes a gain table storage unit 931, a correction unit 932, and a controller 933. The receiver 921, the transmitter 922, the power detector 923, and the attenuator 924, which are included in the RF transceiver 920, may be implemented by separate chips, or some or all of the elements may be implemented by one chip.

The base station 900 provides the TPC in order to control transmission power of the terminal 910. The terminal 910 determines target transmission output power according to the TPC received from the base station 900. The terminal 910 outputs an RF transmission signal based on the determined target transmission output power.

Then, the terminal 910 identifies that the RF transmission signal is currently transmitted by using the target transmission output power, and adjusts a gain according to a result of the identification.

The receiver 921 of the RF transceiver 920 receives the TPC from the base station 900, and provides the received TPC to the controller 933 of the modem 930.

The transmitter 922 outputs a transmission signal according to a control signal, which controls a gain of the transmission signal, based on a transmission gain control from the gain table storage unit 931 of the modem 930. For example, the modem 930 refers to a gain table stored in the gain table storage unit 931, and provides a transmission gain signal to the transmitter 922.

The power detector 923 receives a segment value indicating one of multiple transmission output power ranges from the modem 930, and detects the strength of the RF transmission signal in a transmission output power range corresponding to the received segment value. The power detector 923 transmits the detected output power or voltage value of the RF transmission signal to the correction unit 932 of the modem 930.

The attenuator 924 may feed back the RF transmission signal, which is transmitted via an antenna, to the power detector 923.

The controller 933 of the modem 930 receives the TPC through the RF transceiver 920, and determines the target transmission output power. Then, the controller 933 determines a segment value corresponding to the determined target transmission output power, and provides the determined segment value to the RF transceiver 920.

The gain table storage unit 931 stores gain values corresponding to values of transmission output power.

The correction unit 932 determines a gain correction value by comparing the detected transmission output power, which has been received from the power detector 923, with the target transmission output power, and corrects or updates a gain value stored in the gain table storage unit 931.

Figure 10A:
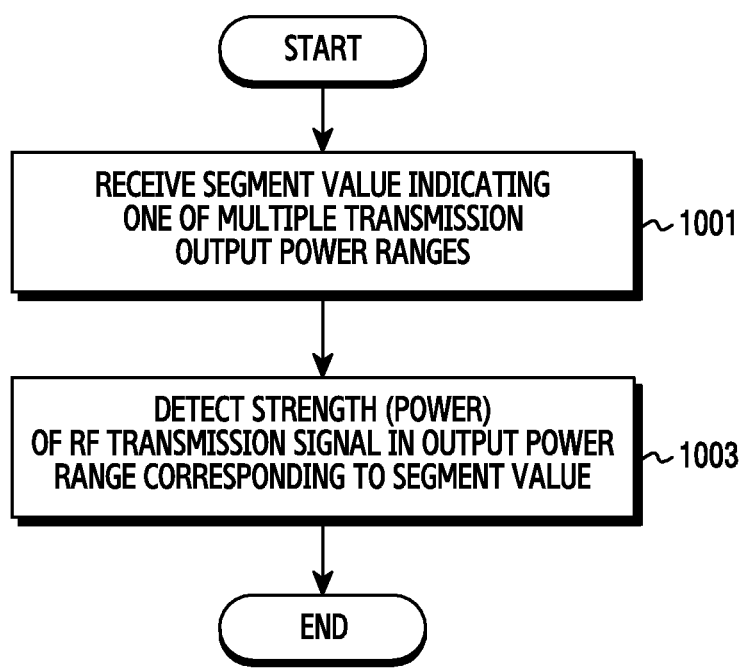
FIGS. 10A and 10B are flowcharts each illustrating the detection of power by an RF transceiver according to an embodiment of the present disclosure.

FIG. 10A is a flowchart illustrating the detection of power by an RF transceiver according to an embodiment of the present disclosure.

Referring to FIG. 10A, in Step 1001, the RF transceiver 920 receives, from the modem 930, a segment value indicating one of multiple transmission output power ranges.

In Step 1003, the RF transceiver 920 detects the strength of an RF transmission signal in an output power range corresponding to the segment value.

For example, the RF transceiver 920 generates an RMS of the RF transmission signal, activates or deactivates respective gain amplifiers and RMS circuits according to the segment value indicating one of the multiple output power ranges, amplifies a gain of the differential transmission output signal through at least two gain amplifiers, and receives the RF transmission signal, for which the gain is amplified. The RF transceiver 920 generates a difference between a first current and a second current of at least two RMS circuits, with the difference between the first current and the second current being the square of the differential transmission output signal, of which the gain is amplified.

As described above, that multiple transmission output power ranges may be distinguished from each other by a state combination of the at least one gain amplifier and the at least one RMS circuit, as activated or deactivated in multiple switch segments.

As also described above, the RF transceiver 920 corrects DC offset in a current signal corresponding to the RMS of the RF transmission signal.

The RF transceiver 920 may also remove a high frequency component from the converted voltage signal.

The RF transceiver 920 receives control information which determines the segment value, and transmits the RF transmission signal.

Figure 10B:
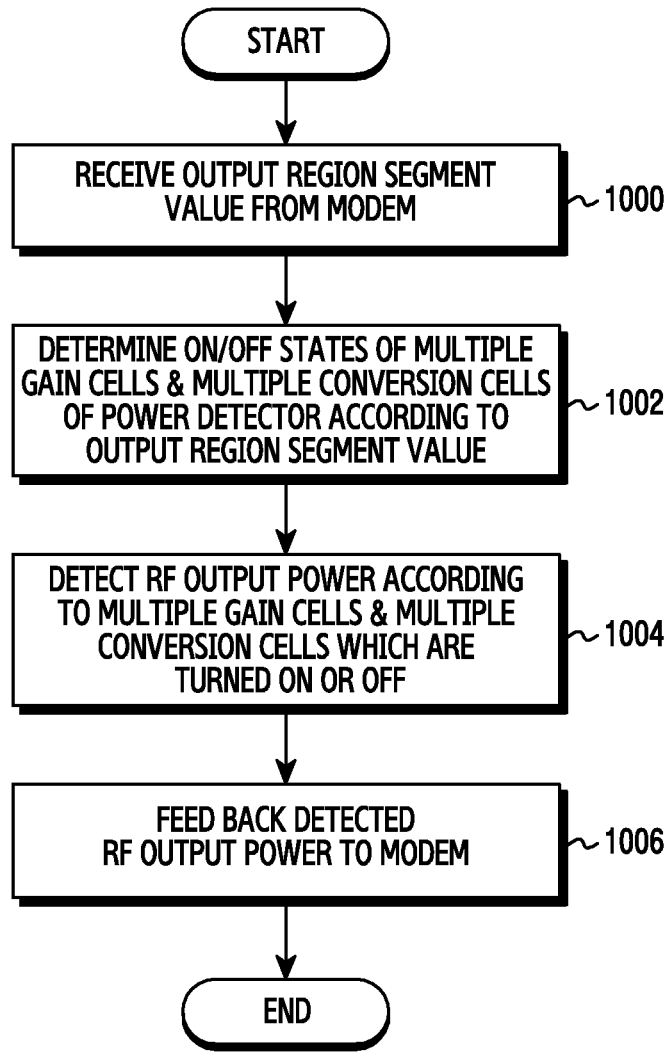

FIG. 10B is a flowchart illustrating the detection of power by an RF transceiver according to an embodiment of the present disclosure.

Referring to FIG. 10B, in Step 1000, the RF transceiver 920 receives an output region segment value from the modem 930. When an entire transmission output power range is divided into multiple output power ranges, the output region segment value is a value indicating one of several output power ranges in the entire transmission output power range.

In Step 1002, the RF transceiver 920 determines on/off states of the multiple gain amplifiers and the multiple conversion cells of the power detector according to the output region segment value. For example, as illustrated in FIGS. 5A-5D and FIGS. 6A-6D, the RF transceiver 920 may activate or deactivate the multiple gain amplifiers and the multiple RMS circuits according to respective segment values.

In Step 1004, the RF transceiver 920 detects an RF output voltage or RF output power according to the multiple gain amplifiers and the multiple RMS circuits which are turned on or off.

In Step 1006, the RF transceiver 920 provides the detected RF output power to the modem 930.

Figure 11:
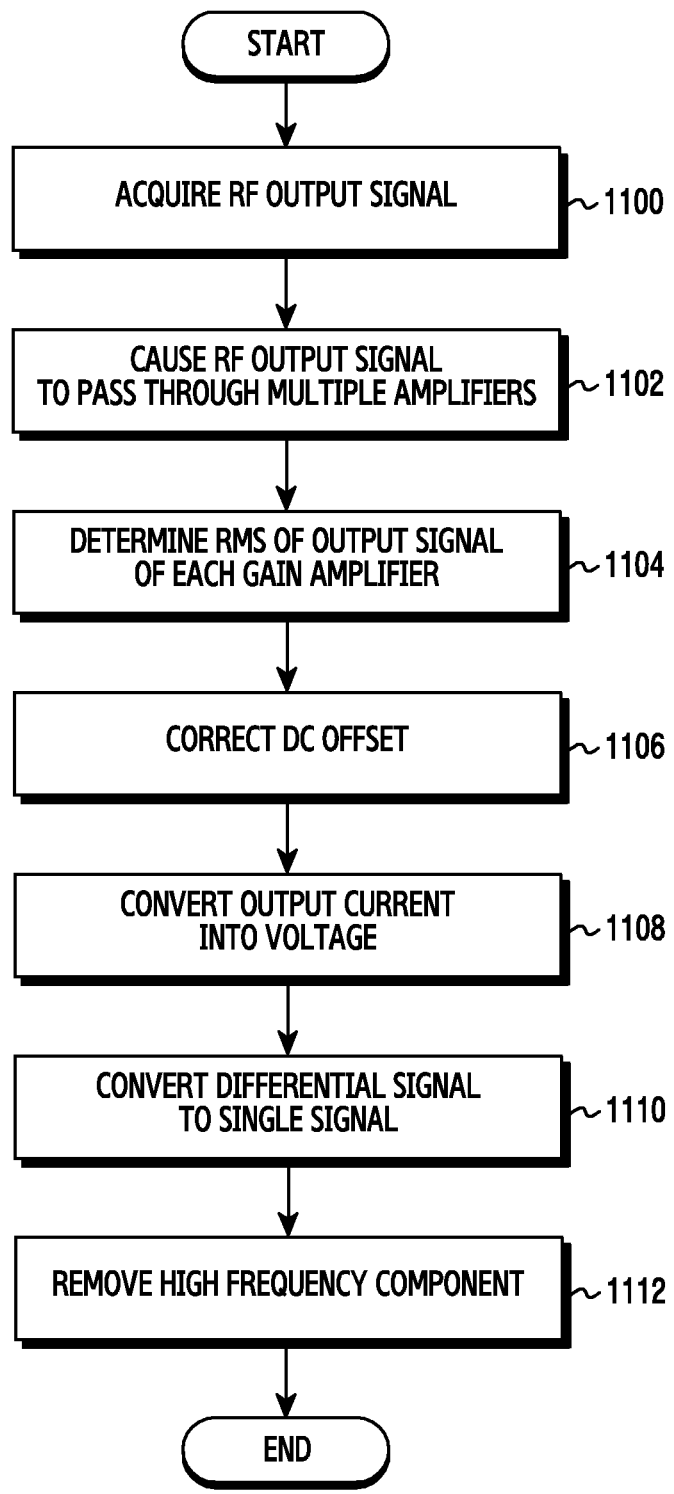
FIG. 11 is a flowchart illustrating an operation of a power detector according to an embodiment of the present disclosure.

FIG. 11 is a flowchart illustrating an operation of a power detector according to an embodiment of the present disclosure.

Referring to FIG. 11, in Step 1100, the power detector acquires an RF output signal. For example, the power detector 923 receives the RF output signal fed back from the attenuator.

In Step 1102, the power detector 923 increases the signal strength by passing the RF output signal through the multiple gain amplifiers.

In Step 1104, the power detector 923 determines an RMS of the output signal, which has passed through the multiple gain amplifiers, through the RMS circuit.

In Step 1106, the power detector 923 corrects DC offset in a current corresponding to the RMS.

In Step 1108, the power detector 923 converts the corrected current signal into a voltage signal.

In Step 1110, the power detector 923 converts the converted voltage signal from a differential signal to a single signal.

In Step 1112, the power detector 923 removes a high frequency component from the converted voltage signal having a single signal component.

Figure 12:
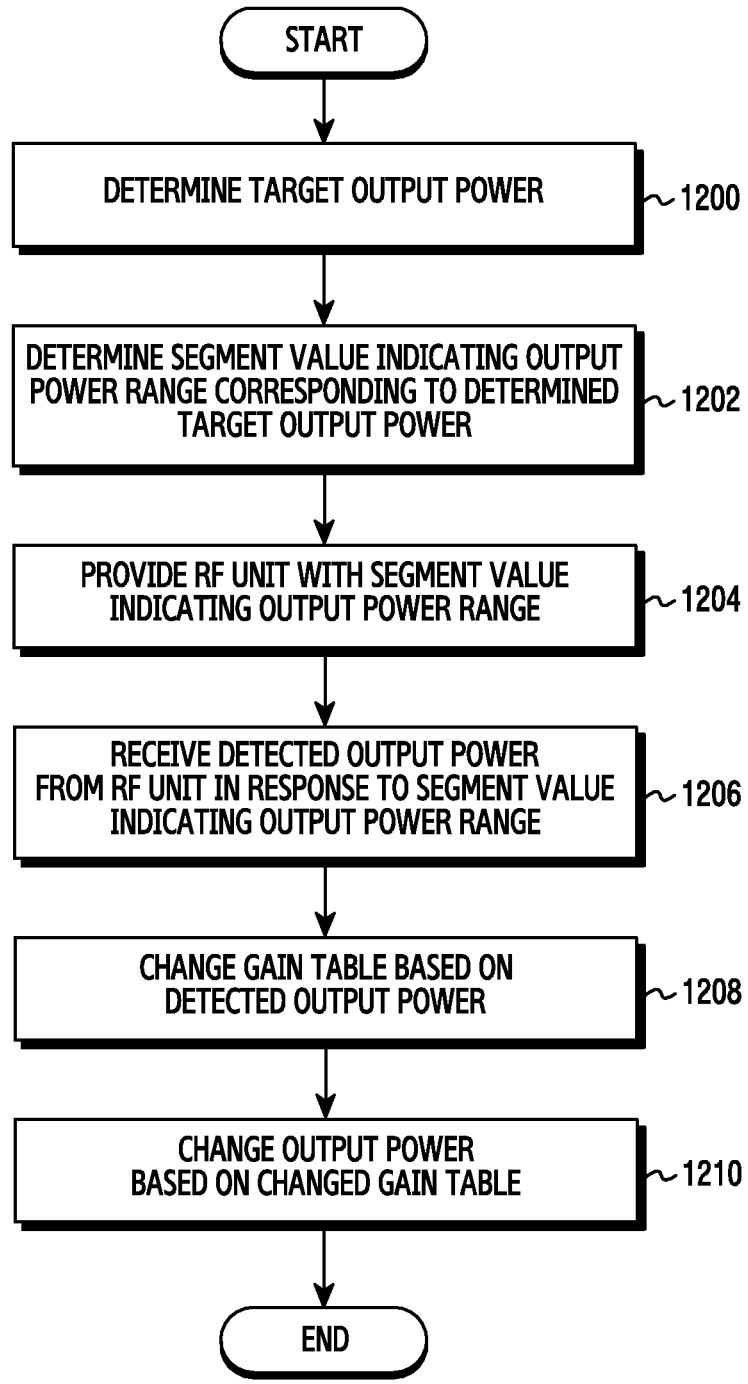
FIG. 12 is a flowchart illustrating an operation of a modem according to an embodiment of the present disclosure.

FIG. 12 is a flowchart illustrating an operation of a modem according to an embodiment of the present disclosure.

Referring to FIG. 12, in Step 1200, the modem 930 receives a TPC control signal from the base station, and determines a target transmission output power.

In Step 1202, the modem 930 determines a segment value indicating an output power range corresponding to the determined target transmission output power.

In Step 1204, the modem 930 provides the RF transceiver 920 with the segment value indicating the transmission output power range.

In Step 1206, the modem 930 receives the detected transmission output power (or voltage) from the RF transceiver 920 in response to the segment value indicating the transmission output power range.

In Step 1208, the modem 930 updates a gain table based on the detected transmission output power.

In Step 1210, the modem 930 determines transmission output power on the basis of the updated gain table.

Figure 13:
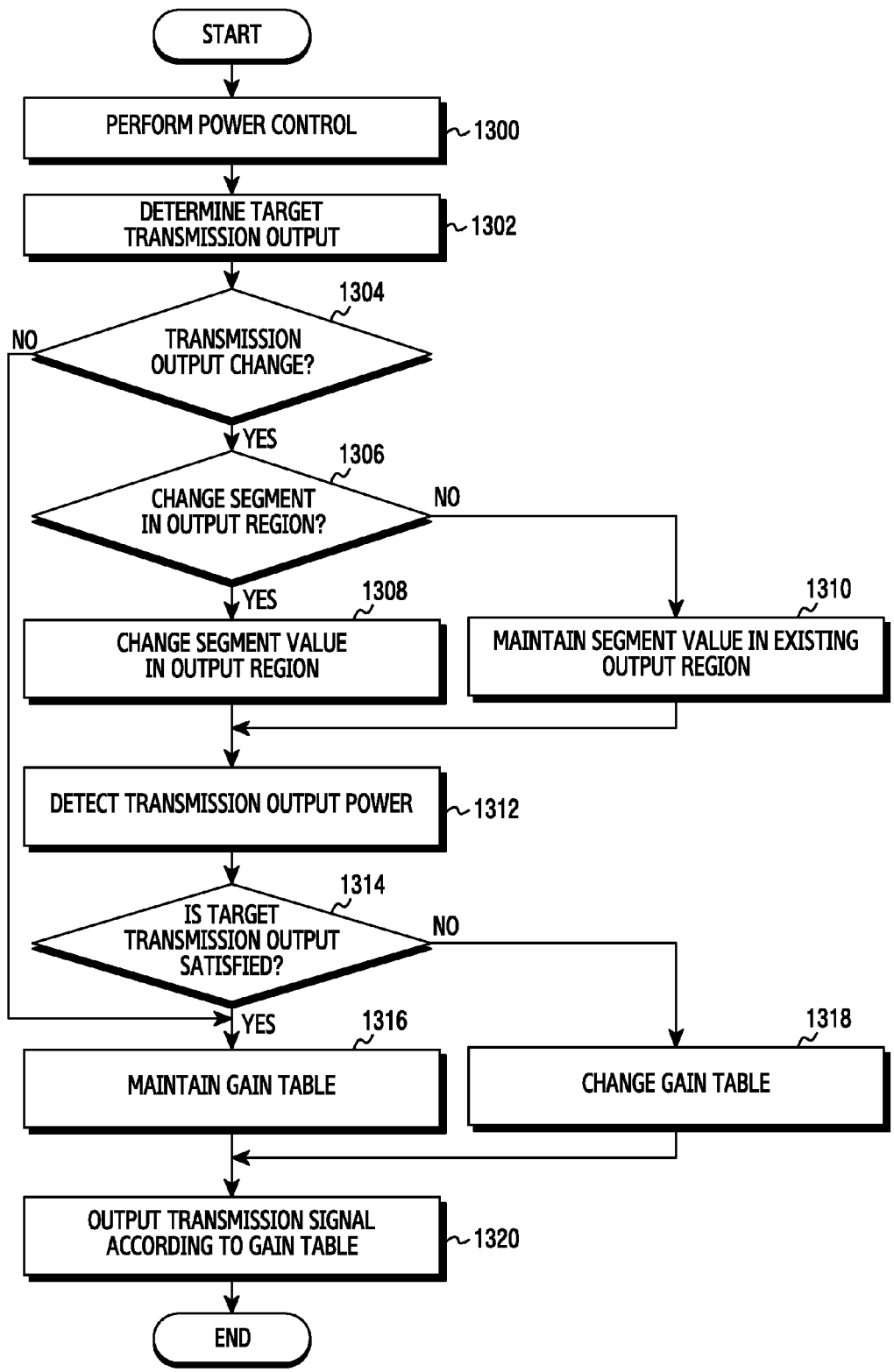
FIG. 13 is a flowchart illustrating an operation of controlling RF transmission output power according to an embodiment of the present disclosure.

FIG. 13 is a flowchart illustrating an operation of controlling RF transmission output power according to an embodiment of the present disclosure.

Referring to FIG. 13, in Step 1300, an electronic device or apparatus performs power control. For example, the electronic device provides downlink channel information to the base station, and receives a TPC control signal corresponding to the downlink channel information.

In Step 1302, a controller of the electronic device controls the determination of a target transmission output on the basis of the power control.

In Step 1304, a determination is made of whether there is a change in transmission output. When there is no change in the transmission output, the method proceeds to Step 1316. When there is a change in transmission output, the method proceeds to Step 1306.

In Step 1306, a determination is made of whether it is necessary to change a segment in an output region. When a segment value is changed, the method proceeds to Step 1308, in which the segment value in the output region changes. In contrast, when the segment value does not change, the method proceeds to Step 1310, in which the segment value is maintained in the existing output region.

The method proceeds to Step 1312, in which current transmission output power is detected.

In Step 1314, in which a determination is made as to whether the currently-detected transmission output power satisfies the target transmission output power. When the currently-detected transmission output power satisfies the target transmission output power, the method proceeds to Step 1316, and no change is made to the gain table. In contrast, if the currently-detected transmission output power does not satisfy the target transmission output power, the method proceeds to Step 1318, and the gain table is updated.

The method proceeds to Step 1320, in which a transmission signal is output according to the gain table.

In the embodiments of the present disclosure, an apparatus for detecting power may include a feedback unit that receives a fed-back RF transmission signal, an RF core unit that generates an RMS of the RF transmission signal, and a conversion unit that converts a current signal corresponding to the RMS of the RF transmission signal into a voltage signal. The RF core unit includes at least two gain amplifiers that amplify a gain of the RF transmission signal, at least two RMS circuits that receive, as input, the RF transmission signal, of which the gain is amplified, and generate a difference between a first current and a second current, with the difference between the first current and the second current being the square of the RF transmission signal, of which the gain is amplified. The apparatus for detecting power also includes multiple switch segments that activate or deactivate the at least one gain amplifier and the at least one RMS circuit according to a segment value indicating one of the multiple output power ranges.

The apparatus for detecting power may further include a converter that converts the converted voltage signal from a differential signal to a single signal.

The apparatus for detecting power may further include a DC correction unit that corrects DC offset in a current signal corresponding to an RMS of the RF transmission signal.

The apparatus for detecting power may further include a filter that removes a high frequency component from the converted voltage signal.

Methods stated in claims and/or specifications according to various embodiments may be implemented by hardware, software, or a combination of hardware and software.

When the methods are implemented by software, a computer-readable storage medium storing at least one program or software module may be provided. The one or more programs stored in the computer-readable storage medium may be configured for execution by one or more processors within the electronic device. The at least one program may include instructions that cause the electronic device to perform the methods according to various embodiments of the present disclosure as defined by the appended claims and/or disclosed herein.

The programs, software modules or software may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the program may be stored in an attachable storage device capable of accessing the electronic device through a communication network such as the Internet, an intranet, a local area network (LAN), a wide LAN (WLAN), a storage area network (SAN), or any combination thereof. Such a storage device may access the electronic device via an external port.

Further, a separate storage device on the communication network may access a portable electronic device.

As described above, movement to another power range segment occurs according to the selection of each gain amplifier and each RMS circuit of the apparatus for detecting power. Therefore, power detection having a wide dynamic range and low power consumption can be performed.

Also, an output voltage is detected in an input power range which is smaller and has better linearity, and thereby an accurate output voltage can be detected.

Although certain embodiments have been described in the detailed description of the present disclosure, the present disclosure may be modified in various forms without departing from the scope of the present disclosure. Therefore, the scope of the present disclosure should not be defined as being limited to the described embodiments, but should be defined by the appended claims and equivalents thereof.

What is claimed is:

1. A Radio Frequency (RF) communication apparatus comprising:
    a transmitter configured to transmit an RF signal;
    an attenuator configured to receive feed back of the transmitted RF signal and transmit a strength of the RF signal; and
    a power detector, comprising a gain amplifier and at least one other gain amplifier, configured to:
        receive a segment value indicating an output power range among multiple transmission output power ranges, and
        detect the strength of the RF signal in the output power range indicated by the segment value using the gain amplifier and the at least one other gain amplifier,
    wherein the gain amplifier and the at least one other gain amplifier are configured to amplify a gain of the RF signal, and
    wherein the at least one other gain amplifier is activated in addition to the gain amplifier according to the segment value.

2. The RF communication apparatus of claim 1, wherein the power detector comprises:
    an RF core unit configured to generate a Root Mean Square (RMS) of the RF signal; and
    a converter configured to convert the RMS of the RF signal into an RMS voltage signal.

3. The RF communication apparatus of claim 2, wherein the RF core unit comprises:
    at least two RMS circuits configured to receive the RF signal, and generate a difference between a first current and a second current, wherein the difference between the first current and the second current is a square of the RF signal; and
    multiple switch segments configured to activate or deactivate at least one RMS circuit of the at least two RMS circuits according to the segment value.

4. The RF communication apparatus of claim 3, wherein the at least two RMS circuits are connected to output terminals of the at least two gain amplifiers, respectively.

5. The RF communication apparatus of claim 3, wherein each of the RMS circuits outputs a square value of the RF signal in the output power range.

6. The RF communication apparatus of claim 3, wherein the multiple transmission output power ranges are distinguished from each other by one of activation and deactivation of one or more of the at least one gain amplifier and the at least one RMS circuit.

7. The RF communication apparatus of claim 2, wherein the power detector further comprises a filter that removes a high frequency component from the RMS voltage signal.

8. The RF communication apparatus of claim 1, wherein the power detector further comprises a direct current (DC) correction unit that corrects a DC offset in a current signal corresponding to an RMS of the RF signal.

9. The RF communication apparatus of claim 1, further comprising a receiver configured to receive a signal which controls a gain of the RF signal.

10. A method of operating a Radio Frequency (RF) communication apparatus, the method comprising:
transmitting an RF signal;
receiving feed back of the transmitted RF signal;
receiving a segment value indicating an output power range among multiple transmission output power ranges;
detecting a strength of the RF signal in the output power range indicated by the segment value using a gain amplifier and at least one other gain amplifier; and
transmitting the strength of the RF signal,
wherein the gain amplifier and the at least one other gain amplifier are configured to amplify a gain of the RF signal, and
wherein the at least one other gain amplifier is activated in addition to the gain amplifier according to the segment value.

11. The method of claim 10, further comprising:
receiving, by at least two RMS circuits, the RF transmission signal; and
generating a difference between a first current and a second current of the at least two RMS circuits.

12. The method of claim 11, wherein the at least two RMS circuits are connected to output terminals of at least two gain amplifiers, respectively.

13. The method of claim 11, wherein each of the RMS circuits outputs a square value of the RF signal in the output power range.

14. The method of claim 11, wherein the multiple transmission output power ranges are distinguished from each other by one of activation and deactivation of the one or more of the at least one gain amplifier and the at least one RMS circuit.

15. The method of claim 10, wherein the detecting of the strength of the RF signal further comprises correcting a direct current (DC) offset in a current signal corresponding to an RMS of the RF transmission signal.

16. The method of claim 10, wherein the detecting of the strength of the RF signal further comprises removing a high frequency component from the converted voltage signal.

17. The method of claim 10, further comprising:
receiving a signal which controls a gain of the RF signal.

* * * * *